(12) United States Patent
Shirani

(10) Patent No.: US 7,406,121 B2
(45) Date of Patent: Jul. 29, 2008

(54) ADAPTIVE CLOCK-LESS EQUALIZER CIRCUIT

(75) Inventor: Ramin Shirani, Morgan Hill, CA (US)

(73) Assignee: Plexus Networks, Inc., Morgan Hill, CA (US)

( * ) Notice: Subject to any disclaimer, the term of this patent is extended or adjusted under 35 U.S.C. 154(b) by 609 days.

(21) Appl. No.: 10/678,999

(22) Filed: Oct. 2, 2003

(65) Prior Publication Data

US 2004/0165660 A1 Aug. 26, 2004

(51) Int. Cl.
*H03H 7/30* (2006.01)
(52) U.S. Cl. ...................................... 375/233
(58) Field of Classification Search .................. 375/233
See application file for complete search history.

(56) References Cited

U.S. PATENT DOCUMENTS

| | | | | |
|---|---|---|---|---|
| 4,594,591 A | * | 6/1986 | Burke | 340/3.9 |
| 5,028,784 A | * | 7/1991 | Arakawa et al. | 250/584 |
| 2001/0043650 A1 | * | 11/2001 | Sommer et al. | 375/232 |
| 2004/0090892 A1 | * | 5/2004 | Kadlec | 369/53.15 |
| 2005/0019042 A1 | * | 1/2005 | Kaneda et al. | 398/208 |

\* cited by examiner

*Primary Examiner*—Dac V Ha
(74) *Attorney, Agent, or Firm*—Sawyer Law Group LLP

(57) ABSTRACT

A system and method for equalizing a signal is provided. In one implementation, the method includes generating a partially equalized signal from an input signal based on a plurality of coefficients associated with a feed-forward equalizer (FFE); generating decoded bit values based on the partially equalized signal, the decoded bit values being an equalized output signal; measuring error in the partially equalized signal; and adjusting the coefficients associated with the feed-forward equalizer (FFE) based on the error measured in the partially equalized signal. Values of the coefficient are not used to adjust of the coefficients associated with the feed-forward equalizer (FFE).

10 Claims, 3 Drawing Sheets

14

ADAPTIVE CLOCK-LESS EQUALIZER CIRCUIT

RELATED APPLICATION

This application is related to U.S. patent application Ser. No. 10/679,107, entitled "Low-Power, High-Frequency Finite Impulse Finite Response (FIR) Filter and Method of Use," and filed on Oct. 2, 2003.

FIELD OF THE INVENTION

The present invention relates generally to equalization of signals in a circuit.

BACKGROUND OF THE INVENTION

Adaptive equalizer systems determine and provide equalizations required for a received waveform to ultimately resemble the originally transmitted waveform. There are currently systems on the market which use transversal filters to equalize a signal to correct the impairments in the signal caused by various sources (e.g., inter-symbol interference (ISI) cross-talk, polarization mode dispersion (PMD)). Most implementations must recover the timing data before, or at the same time as the equalizer, so that it can properly process data. For example, typically in DSP equalizers all tap values (i.e., the intermediate signal values at the output of a delay stage of the equalizer) must be digitized and known.

Accordingly, what is needed is a system and method for providing an equalizer of signals for a circuit which does not require the timing recovery of data. The present invention addresses such a need.

SUMMARY OF THE INVENTION

A method and system for adaptive equalization without having to have a clock recovery loop to recover data bits in clock is disclosed. This provides a clock-less equalization method. A system and method in accordance with the present invention can be utilized advantageously in devices where binary data is traveling through fiber (both single mode and multi-mode fiber) contaminated by certain characteristics of the fiber, which cause impairments. For a given data frequency, these impairments limit the length of the fiber that can be used for transmission of the data, and thus require equalization.

The advantage of this method is that it does not require the integration of the clock recovery on the same IC, which avoids the known issues with the equalizer and the phase locked loop interaction for transversal filters (since they both try to converge at the same time). This also eases the scaling of the equalizer to higher speeds as the redesign of the CDR is not required. The present invention makes possible the advantages of providing an adaptive equalizer for equalizing high-speed data signals and of providing a digitally controlled adaptive equalizer which can be widely tuned and adjusted for various applications.

DETAILED DESCRIPTION

The present invention relates generally to equalization of signals in a circuit. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
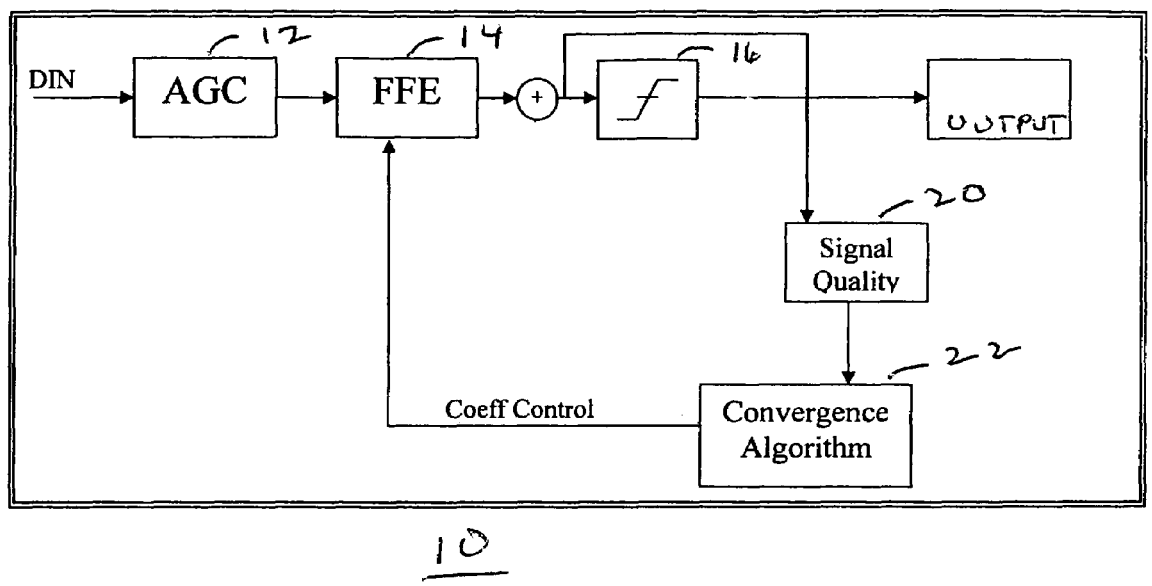
FIG. 1 is a top level diagram of an adaptive equalizer in accordance with the present invention.

FIG. 1 is a top level diagram of an adaptive equalizer 10 in accordance with the present invention. Din is the data input of the equalizer 10. The data is provided to an Analog Gain Control (AGC) 12, so that any DC loss can be adjusted and proper signal amplitude obtained. Next, the signal is fed into a Feed Forward Equalizer (FFE) 14 (per description in U.S. patent application Ser. No. 10/679,107, entitled "Low-Power High-Frequency Finite Impulse Finite Response (FIR) Filter and Method of Use", and incorporated by reference herein). The partially equalized signal out of FFE 14 is sliced through the slicer 16. The slicer 16 compares the signal against a known detection reference (so as to convert the data to zeros and ones), and hence decode the bit values.

At the same time a signal quality circuit 20 is used to measure the quality of the signal by measuring the error of the signal and feeding this error information to a convergence algorithm circuit 22. The convergence algorithm circuit 22 receives the error information and tries to minimize the error input to be as small as possible. The convergence algorithm circuit 22 accomplishes this by controlling the coefficients of the main equalizer section of the FFE 14. At an optimum setting of these coefficients, the error is minimized and the equalization is at its optimum point. This feedback procedure is ongoing in time and hence the name adaptive equalizer.

Figure 2:
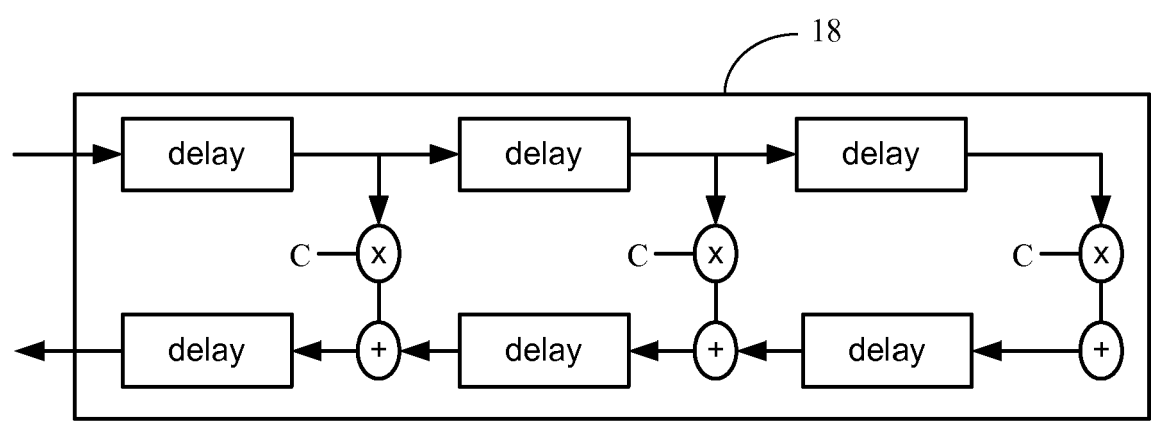
FIG. 2 is the detail of the implementation of the FFE block.
Figure 3:
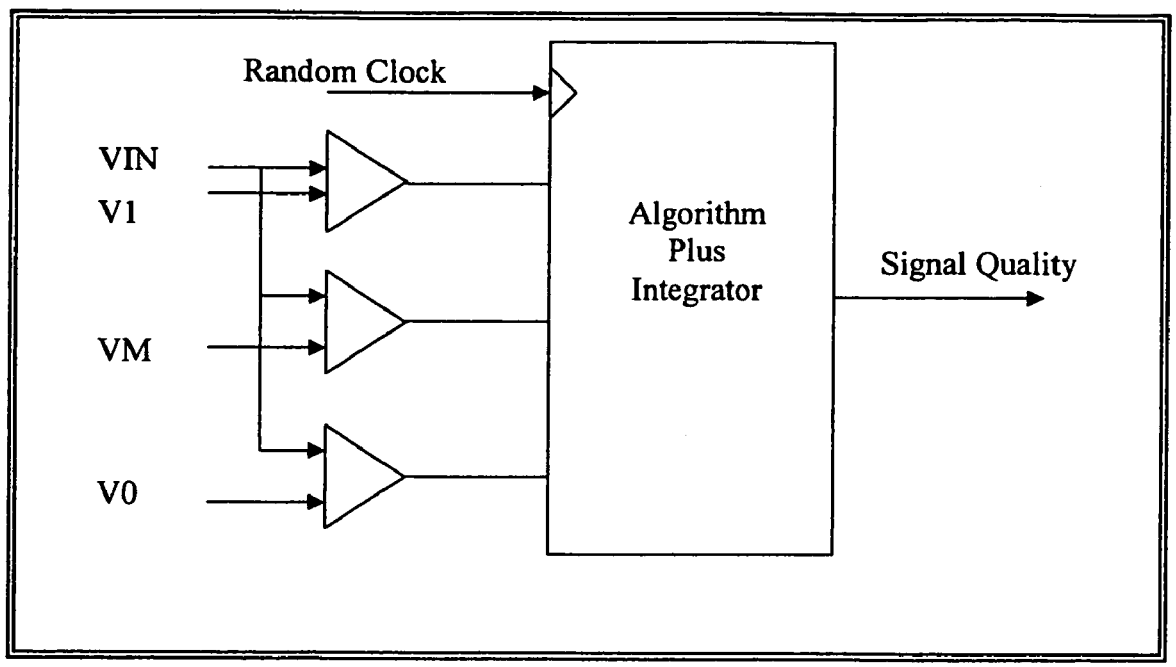
FIG. 3 is a block diagram of a signal quality circuit in accordance with the present invention.

FIG. 2 is the detail of an implementation of a preferred embodiment of the FFE 14. One embodiment of the implementation of FFE 14 uses a microwave amplifier delay line (per U.S. patent application Ser. No. 10/679,107), to create a fractionally spaced (the delays are less than a data bit time) transversal filter 18. However, a system and method in accordance with the present invention applies equally well to other non-microwave feed forward implementations. Each delay stage of the FFE 14 delays the signal by a fraction of a bit time, multiplies it by a coefficient C (from the convergence algorithm circuit 22) and sums the signal back with the delayed version of other stages (as described in more detail in U.S. patent application Ser. No. 10/679,107). The final result is then processed by the signal quality circuit 20 (as shown in FIG. 1). FIG. 3 depicts the signal quality circuit 20 of FIG. 1 in greater detail. The present invention implements three comparators that compare the input (VIN is the output of the FFE/DFE sum circuitry) to a binary high (V1), a binary low (V0) and the mid-level (VM). The mid-level is the same as the slicer output, which signifies whether the output data is high or low (FIG. 1). Any time the input (VIN) is higher than the VM but lower than V1, it is logged as amplitude too low. Accordingly, any time the signal is lower than VM, but higher than V0, it is logged as too low amplitude. The output of these three comparators is sampled with a random clock. Since the frequency of the data input is well known, it is rather simple to create a clock that is not a harmonic frequency of the data. The sampling is done a large number of times (5000 in a preferred embodiment). Out of these 5000, a set percentage of the samples have amplitude that is too low.

For example, in scrambled data patterns one expects to get around 25% of the signals to be too low, while 75% are not. Note that this percentage does not need to be fixed, and can be user programmable so as to cover any data pattern. The coefficients are therefore adjusted to accomplish this ratio (ratio of amplitude too low to amplitude OK). This assures that the output waveform has the proper amplitude and shape at each of the binary values. A similar method would use the recovered clock from a clock data recovery circuit and sample the output of the comparators at each of the binary values.

There are a few possibilities for the signal quality measurements. One would be to randomly sample the amplitude of the waveform and calculate the error at the sampling point which does not have to be in the middle of the eye (can not locate the middle of each bit time since no data recovery). The error is then integrated over some period of time. This error (signal quality) is then used by a convergence algorithm to set the tap coefficients. Note that the tap values (intermediate signal values at the output of each delay stage) do not need to be known since the gradient of the error is measured by individually modifying the tap coefficients. The convergence algorithm only uses the signal quality to adapt the coefficients. Note that in this algorithm the tap values are not needed, whereas with most common algorithms used such as in least mean squared (LMS), the tap values are needed. The values are not needed because the gradient is measured through individually modifying the tap coefficients.

A system and method in accordance with the present invention does not use the recovered clock. Even though the present embodiment is depicted, it is obvious to anyone familiar with such art that other embodiments accomplish the same result and it is therefore not necessary to specifically mention all possible embodiments here.

APPLICATION OF THE INVENTION

As described above, the length of the fiber used for transmission of binary data is limited by fiber impairment. The invention allows extending the read of the fiber through the use of the adaptive equalizer by keeping the adaptive equalizer and clock recovery independent of each other. Specifically a method in accordance with the present invention can be applied to the transmission of 10G data over legacy multimode fiber (high differential mode delay dispersion factor) and have shown that data can be successfully received over 300 meters of multimode fiber. However, the present invention is general enough to be applied to other applications, which can benefit from equalization (be it fiber or other media of transmission).

The present invention relates currently to general equalization of signals with any impairment. This method has been applied to impairments caused by polarization mode dispersion, impairment caused by signal traveling on a back-plane board trace, and multi-mode fiber impairment; however, the method is general enough and adaptive to be applied to any signal impairments.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An adaptive equalizer for equalizing a signal, the adaptive equalizer comprising:
    a feed-forward equalizer (FFE) to receive an input signal and generate a partially equalized signal from the input signal based on a plurality of coefficients associated with the feed-forward equalizer (FFE);
    a slicer to receive the partially equalized signal and generate decoded bit values based on the partially equalized signal;
    a signal quality circuit to receive the partially equalized signal from the feed-forward equalizer (FFE) and measure error in the partially equalized signal; and
    a convergence algorithm circuit to use a convergence algorithm for adjusting the coefficients associated with the feed-forward equalizer (FFE) based on the error measured in the partially equalized signal by the signal quality circuit,
    wherein values of the coefficient are not needed by the convergence algorithm to determine how much to adjust of the coefficients associated with the feed-forward equalizer (FFE).

2. The adaptive equalizer of claim 1, wherein the feed-forward equalizer (FFE) comprises a fractionally spaced transversal filter.

3. The adaptive equalizer of claim 2, wherein the feed-forward equalizer (FFE) further comprises a plurality of delay stages, each delay stage delaying the input signal by a fraction of a bit time and multiplies the input signal by a given coefficient associated with the feed-forward equalizer (FFE).

4. The adaptive equalizer of claim 1, further comprising an analog gain control circuit to receive a data input signal and generate the input signal for input to the feed-forward equalizer (FFE).

5. The adaptive equalizer of claim 1, wherein the signal quality circuit comprises three comparators to respectively compare the partially equalized signal from the feed-forward equalizer (FFE) to a binary high (V1), a binary low (V0), and a mid-level (VM) that is the same as an output of the slicer to determine whether an amplitude of the output of the slicer is too high or too low.

6. The adaptive equalizer of claim 5, wherein the amplitude of the output of the slicer is determined to be too low when:
    the partially equalized signal from the feed-forward equalizer (FFE) is higher than the mid-level (VM) but lower than the binary high (V1); and
    the partially equalized signal from the feed-forward equalizer (FFE) is lower than the mid-level (VM) but higher than the binary low (V0).

7. The adaptive equalizer of claim 6, wherein convergence algorithm circuit further adjusts the coefficients of the feed-forward equalizer (FFE) such that a pre-determined percentage of the decoded bit values are determined to be too low.

8. A method for equalizing a signal, the method comprising:
    generating a partially equalized signal from an input signal based on a plurality of coefficients associated with a feed-forward equalizer (FFE);
    generating decoded bit values based on the partially equalized signal, the decoded bit values being an equalized output signal;
    measuring error in the partially equalized signal; and
    using a convergence algorithm to adjust the coefficients associated with the feed-forward equalizer (FFE) based on the error measured in the partially equalized signal, wherein values of the coefficient are not needed by the convergence algorithm to determine how much to adjust of the coefficients associated with the feed-forward equalizer (FFE).

9. The method of claim 8, further comprising comparing the partially equalized signal from the feed-forward equalizer (FFE) to a binary high (V1), a binary low (V0), and a mid-level (VM) that is the same as the equalized output signal to determine whether an amplitude of the equalized output signal is too high or too low.

10. The method of claim 9, wherein adjusting the coefficients of the feed-forward equalizer (FFE) further includes adjusting the coefficients of the feed-forward equalizer (FFE) such that a pre-determined percentage of the decoded bit values are determined to be too low.

* * * * *